United States Patent
Seol et al.

(10) Patent No.: US 12,009,367 B2
(45) Date of Patent: Jun. 11, 2024

(54) MOBILE TERMINAL

(71) Applicant: LG ELECTRONICS INC., Seoul (KR)

(72) Inventors: Seounghwan Seol, Seoul (KR); Hangyu Oh, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 427 days.

(21) Appl. No.: 16/973,653

(22) PCT Filed: Oct. 15, 2018

(86) PCT No.: PCT/KR2018/012107
§ 371 (c)(1),
(2) Date: Dec. 9, 2020

(87) PCT Pub. No.: WO2019/240332
PCT Pub. Date: Dec. 19, 2019

(65) Prior Publication Data
US 2021/0257390 A1 Aug. 19, 2021

(30) Foreign Application Priority Data

Jun. 11, 2018 (KR) .................. 10-2018-0066577
Oct. 2, 2018 (KR) .................. 10-2018-0117522

(51) Int. Cl.
*H01L 27/12* (2006.01)
*G02F 1/1362* (2006.01)
*G02F 1/1368* (2006.01)

(52) U.S. Cl.
CPC ...... *H01L 27/124* (2013.01); *G02F 1/136286* (2013.01); *G02F 1/1368* (2013.01)

(58) Field of Classification Search
CPC ............. H01L 27/124; H01L 27/3276; H01L 2251/5338; G02F 1/136286; H10K 59/131
See application file for complete search history.

(56) References Cited

U.S. PATENT DOCUMENTS

2007/0069995 A1* 3/2007 Shin .................. H01L 27/3232
345/76
2017/0288003 A1* 10/2017 Kim .................. H10K 59/131
(Continued)

FOREIGN PATENT DOCUMENTS

KR  10-2016-0000817   1/2016
KR  1020170065059    6/2017
(Continued)

OTHER PUBLICATIONS

PCT International Application No. PCT/KR2018/012107, International Search Report dated Feb. 28, 2019, 9 pages.
(Continued)

*Primary Examiner* — Peter M Albrecht
(74) *Attorney, Agent, or Firm* — LEE, HONG, DEGERMAN, KANG & WAIMEY

(57) ABSTRACT

In order to minimize an additional non-output region that is generated when a wire bypasses a non-output region of a display, a mobile terminal is provided which comprises: a display panel including the non-output region; a TFT (Thin Film Transistor) substrate included in the display panel; a TFT wire that is provided on a front surface of the TFT substrate to form an output region and is isolated in the non-output region; a via hole formed at the isolated point of the TFT substrate; and a bypass wire for connecting the isolated TFT wire through the via hole.

9 Claims, 11 Drawing Sheets

(56) References Cited

U.S. PATENT DOCUMENTS

2018/0219058 A1* 8/2018 Xiang ................. H01L 27/3276
2019/0214596 A1* 7/2019 Park ..................... H10K 59/131

FOREIGN PATENT DOCUMENTS

| KR | 1020170071269 | 6/2017 |
| KR | 1020170117291 | 10/2017 |
| KR | 1020170137230 | 12/2017 |
| KR | 1020180049296 | 5/2018 |

OTHER PUBLICATIONS

Korean Intellectual Property Office Application No. 10-2018-0117522, Office Action dated Jan. 17, 2023, 4 pages.

* cited by examiner

--PRIOR ART--

(a)

(b)

(c)

(a)

(b)

(a)

(b)

(a)

(b)

MOBILE TERMINAL

CROSS-REFERENCE TO RELATED APPLICATIONS

This application is the National Stage filing under 35 U.S.C. 371 of International Application No. PCT/KR2018/012107, filed on Oct. 15, 2018, which claims the benefit of earlier filing date and right of priority to Korean Application Nos. 10-2018-0066577, filed on Jun. 11, 2018 and 10-2018-0117522, filed on Oct. 2, 2018, the contents of which are all hereby incorporated by reference herein their entirety.

TECHNICAL FIELD

The present disclosure relates to a mobile terminal having a display panel that requires bypass of a wire.

BACKGROUND ART

An output region of a general display is implemented by vertically crossing a plurality of gate lines and a plurality of data lines.

However, in line with a recent trend for maximizing a display region, attempts to implement display regions of various shapes are continuing. This includes a case in which electronic components such as a camera hole, a receiver, and the like are arranged in the display region.

Such electronic component is disposed in a non-output region such as a notch of a notch display, a hole of a hole display, or the like.

Because of such region, a region in which the gate line and the data line are not able to be arranged orthogonally in a straight line occurs on the display. Even when there is an isolated region in an arbitrary horizontal line or vertical line of the display, wires must be successively maintained to enable normal display output. Therefore, for the successiveness of the wires, a pattern of the wires bypassing the non-output region of the notch display or the non-output region of the hole display is formed.

In the case of the pattern of the bypassing wires, it is necessary to secure a space of the bypassing wires. Thus, in addition to the minimum non-output region for the arrangement of the electronic components, an additional region for the wire bypass also becomes the non-output region. This is contrary to the recent trend of maximizing the display output region.

DISCLOSURE

Technical Purpose

The present disclosure aims to minimize an additional non-output region occurred as a wire bypasses a non-output region for arrangement of electronic components on a display, which is the aforementioned problem.

Technical Solutions

According to one aspect of the present disclosure to achieve the above or other purposes, provided is a mobile terminal including a display panel including a non-output region, a TFT substrate included in the display panel, a TFT (Thin Film Transistor) wire disposed on a front surface of the TFT substrate to define an output region, and isolated in the non-output region, each via hole defined at each isolated point of the TFT substrate, and a bypass wire for connecting isolated portions of the TFT wire with each other through the via holes.

Further, according to another aspect of the present disclosure, provided is the mobile terminal, wherein the bypass wire includes each vertical connection wire passing through each via hole, and a horizontal connection wire for connecting ends of the vertical connection wires with each other.

Further, according to another aspect of the present disclosure, provided is the mobile terminal, wherein the horizontal connection wire is disposed on the TFT substrate.

Further, according to another aspect of the present disclosure, provided is the mobile terminal, wherein the display panel further includes a lower polarizing plate disposed on a rear surface of the TFT substrate, wherein the horizontal connection wire is disposed on the lower polarizing plate.

Further, according to another aspect of the present disclosure, provided is the mobile terminal, wherein the display panel further includes a lower polarizing plate disposed on a rear surface of the TFT substrate, and an additional layer disposed between the lower polarizing plate and the TFT substrate, wherein the horizontal connection wire is disposed on the additional layer.

Further, according to another aspect of the present disclosure, provided is the mobile terminal, wherein each via hole is defined in a region corresponding to each electrode of the TFT wire.

Further, according to another aspect of the present disclosure, provided is the mobile terminal, wherein the non-output region corresponds to a notch region of a notch display.

Further, according to another aspect of the present disclosure, provided is the mobile terminal, wherein the non-output region corresponds to a sensor hole.

Further, according to another aspect of the present disclosure, provided is the mobile terminal, wherein the TFT wire is a gate line.

Further, according to another aspect of the present disclosure, provided is the mobile terminal further including a first GIP (Gate in Panel) and a second GIP arranged on one side of the non-output region and connected to each other, and a third GIP and a fourth GIP arranged on the other side of the non-output region and connected to each other.

Further, according to another aspect of the present disclosure, provided is the mobile terminal, wherein the same voltage is applied to one of the first GIP and the second GIP and one of the third GIP and the fourth GIP.

Advantageous Effects

Effects of a mobile terminal device according to the present disclosure are as follows.

According to at least one of the embodiments of the present disclosure, there is an advantage that the display output region may be maximized.

Further scope of the applicability of the present disclosure will become apparent from a detailed description below. However, various changes and modifications within the spirit and scope of the present disclosure may be clearly understood by those skilled in the corresponding technical field, so that it is to be understood that the detailed description and specific embodiments such as preferred embodiments of the present disclosure are given by way of example only.

Figure 2A:
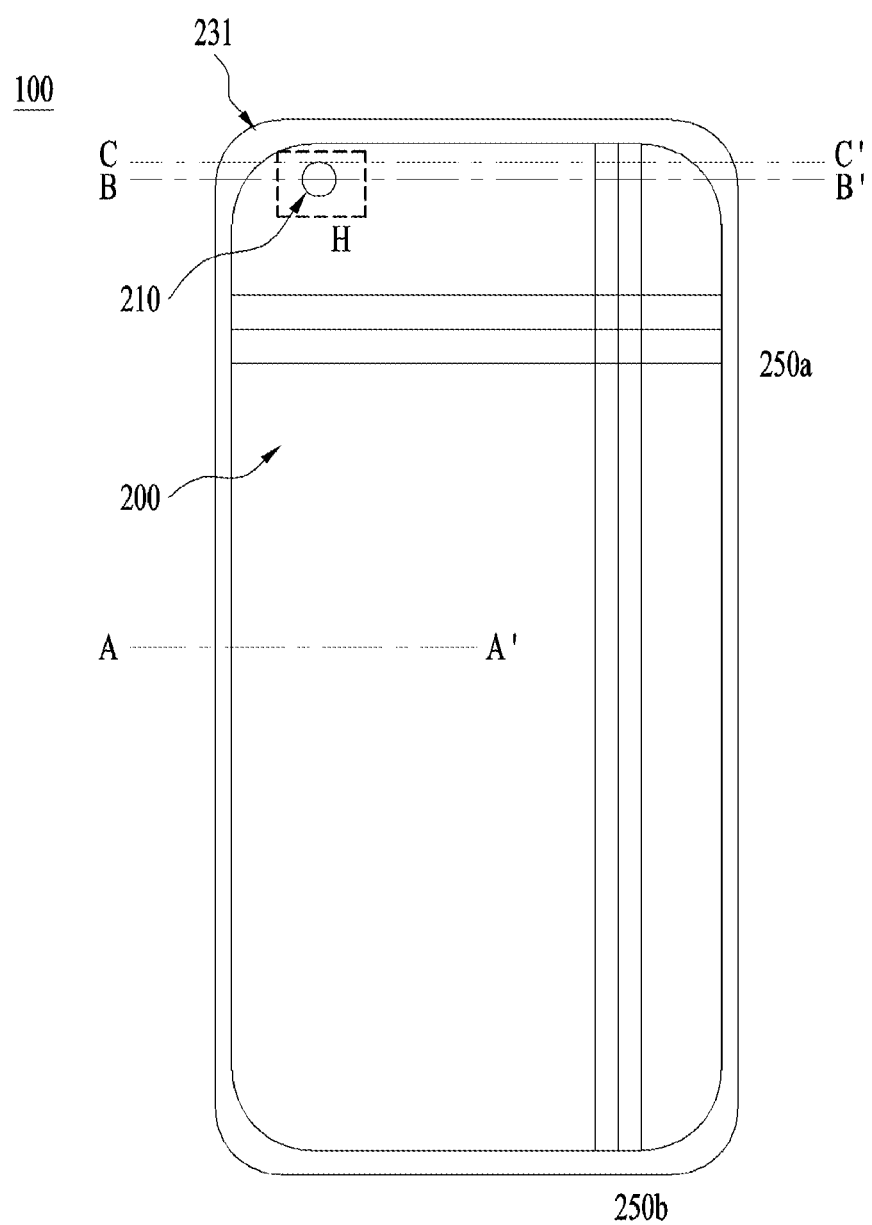
FIGS. 2A-2B are front views of a mobile terminal in accordance with the present disclosure.
Figure 5:
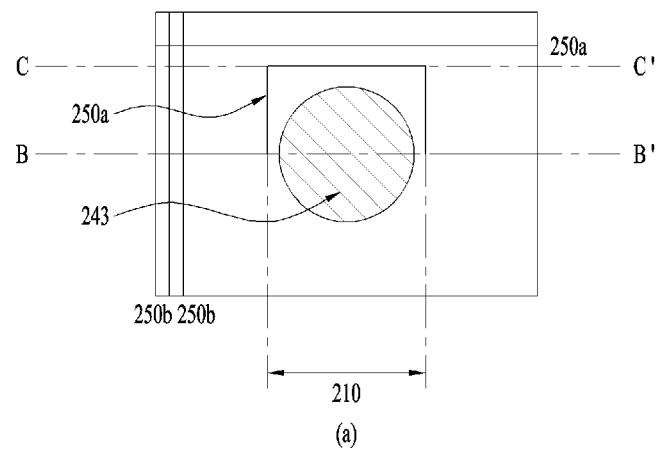
Figure 5:
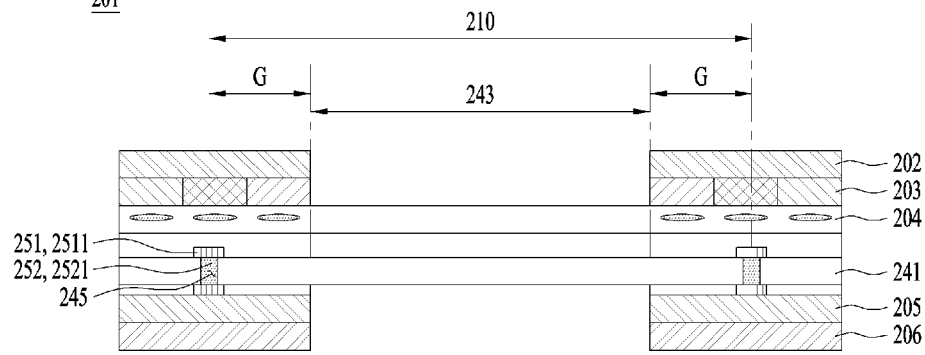
Figure 5:
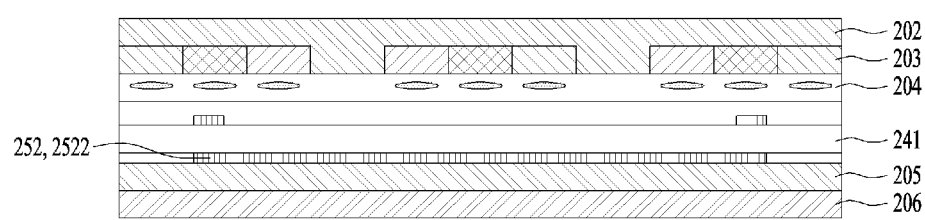

(a) in FIG. 5 is a conceptual diagram of a region H in FIG. 2A, (b) in FIG. 5 is a cross-sectional view taken along a line B-B' in FIG. 2A, and (c) in FIG. 5 is a cross-sectional view taken along a line C-C' in FIG. 2A.

Figure 6:
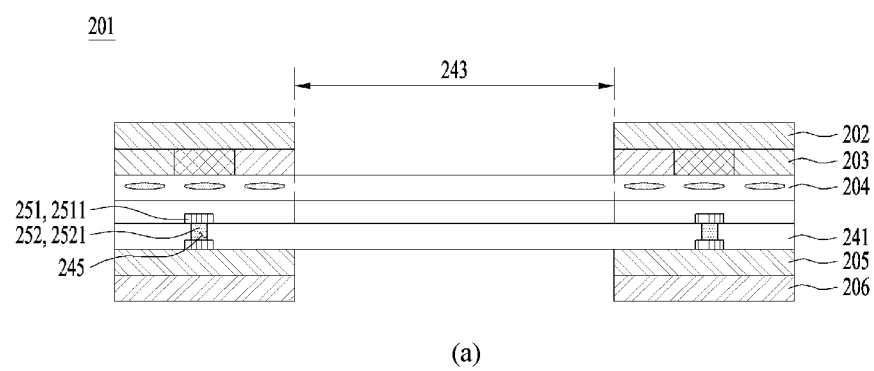
Figure 6:
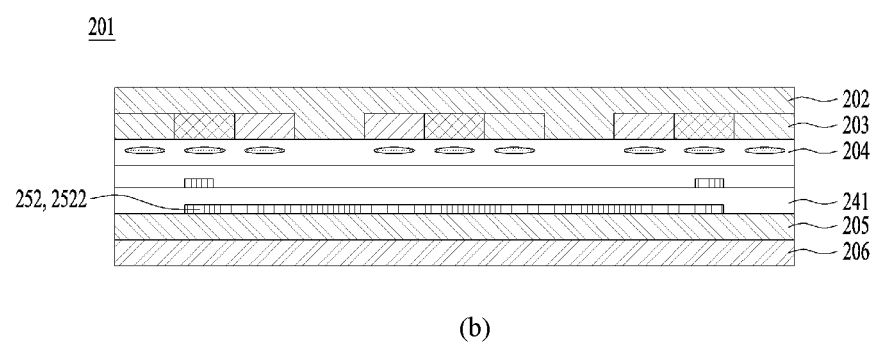

FIG. 6 is an embodiment of a mobile terminal in accordance with the present disclosure.

Figure 7:
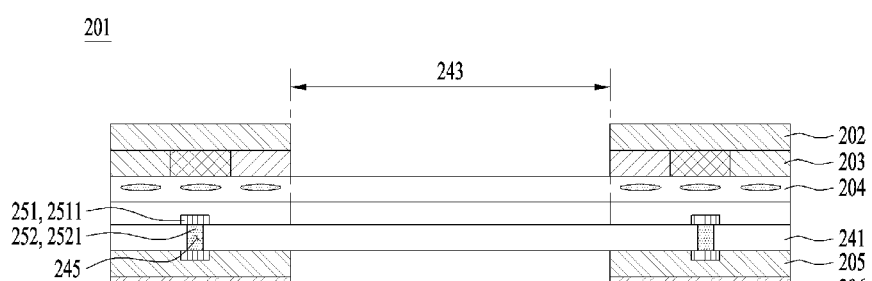
Figure 7:
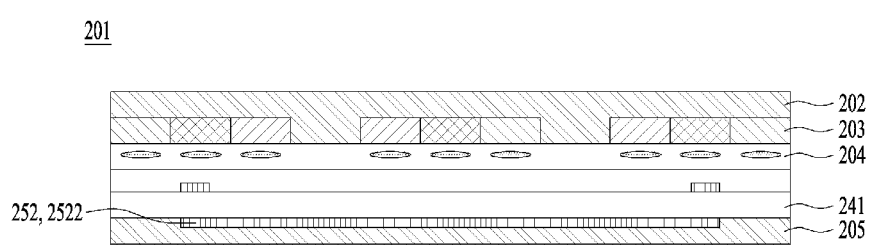

FIG. 7 is an embodiment of a mobile terminal in accordance with the present disclosure.

Figure 8:
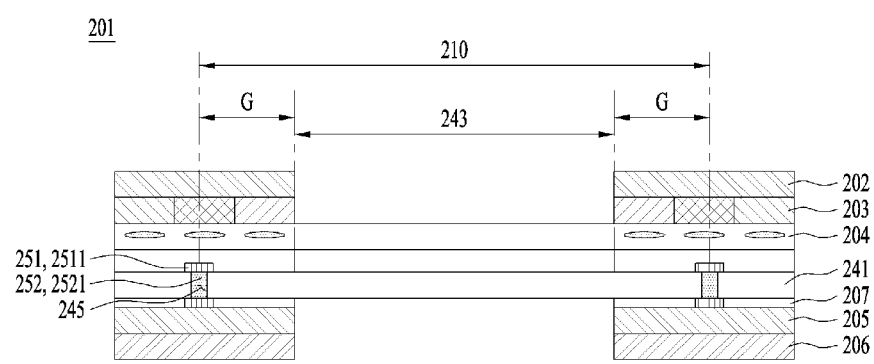
Figure 8:
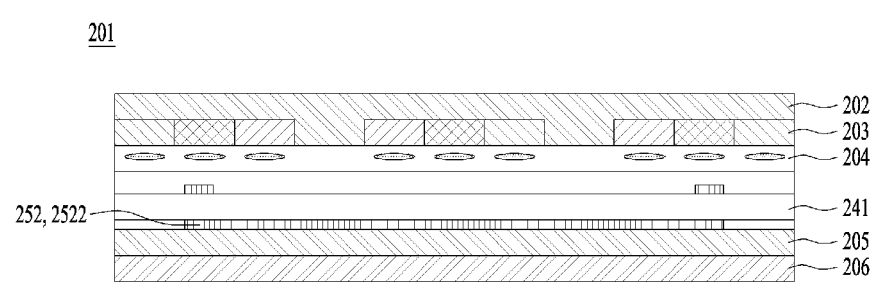

FIG. 8 is an embodiment of a mobile terminal in accordance with the present disclosure.

Figure 9:
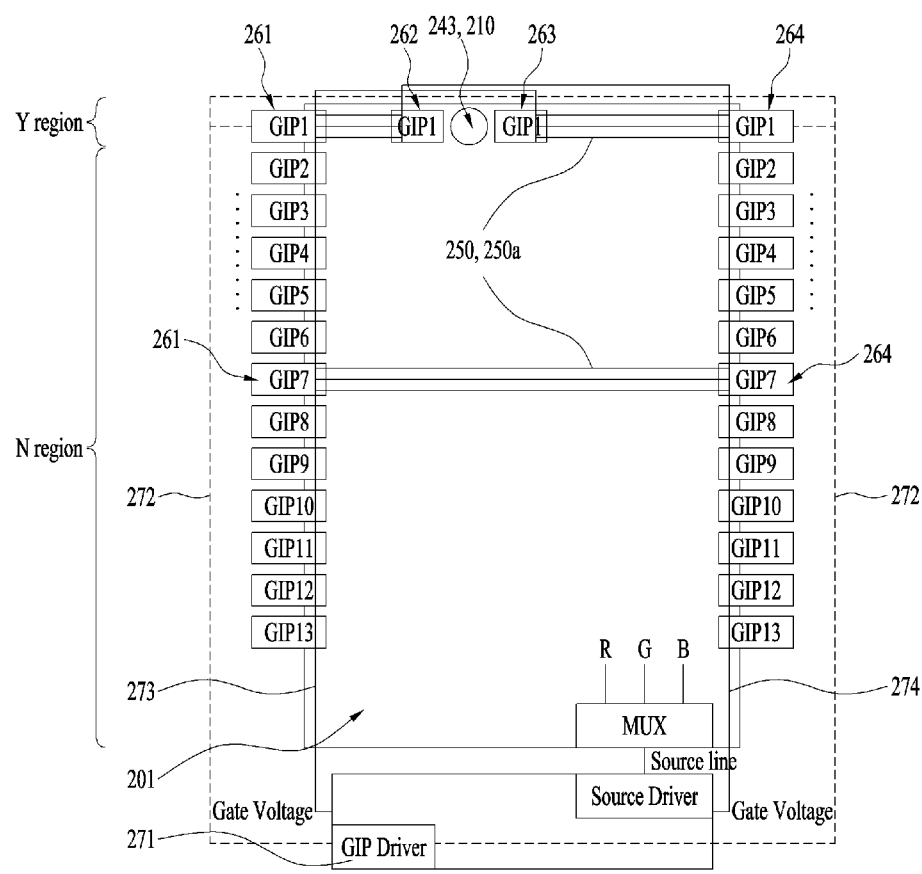

FIG. 9 is an embodiment of a mobile terminal in accordance with the present disclosure.

BEST MODE

Description will now be given in detail according to exemplary embodiments disclosed herein, with reference to the accompanying drawings. For the sake of brief description with reference to the drawings, the same or equivalent components may be provided with the same reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In the present disclosure, that which is well-known to one of ordinary skill in the relevant art has generally been omitted for the sake of brevity. The accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings.

Mobile terminals presented herein may be implemented using a variety of different types of terminals. Examples of such terminals include cellular phones, smart phones, user equipment, laptop computers, digital broadcast terminals, personal digital assistants (PDAs), portable multimedia players (PMPs), navigators, portable computers (PCs), slate PCs, tablet PCs, ultra books, wearable devices (for example, smart watches, smart glasses, head mounted displays (HMDs)), and the like.

By way of non-limiting example only, further description will be made with reference to particular types of mobile terminals. However, such teachings apply equally to other types of terminals, such as those types noted above. In addition, these teachings may also be applied to stationary terminals such as digital TV (television), desktop computers, and the like.

Figure 1A:
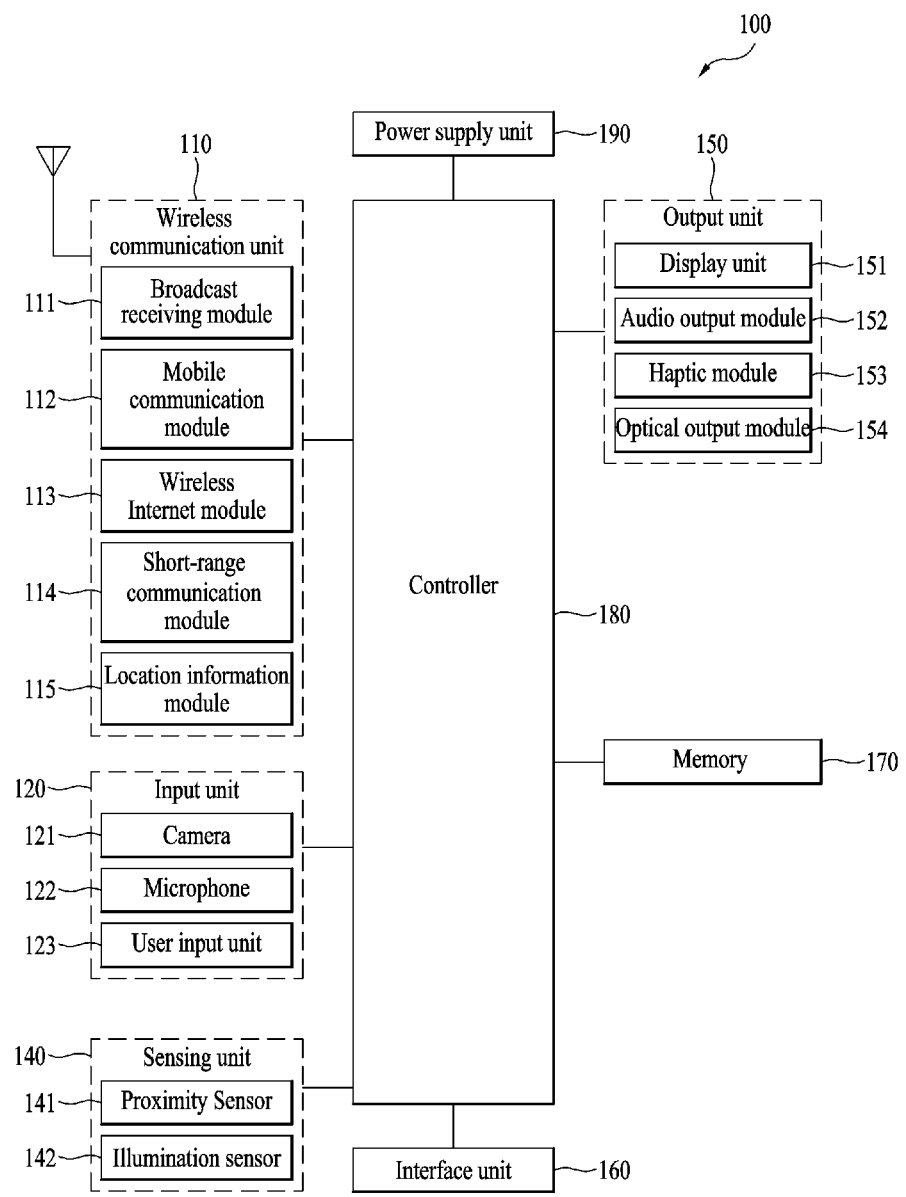
FIG. 1A is a block diagram of a mobile terminal in accordance with the present disclosure.
Figure 1B:
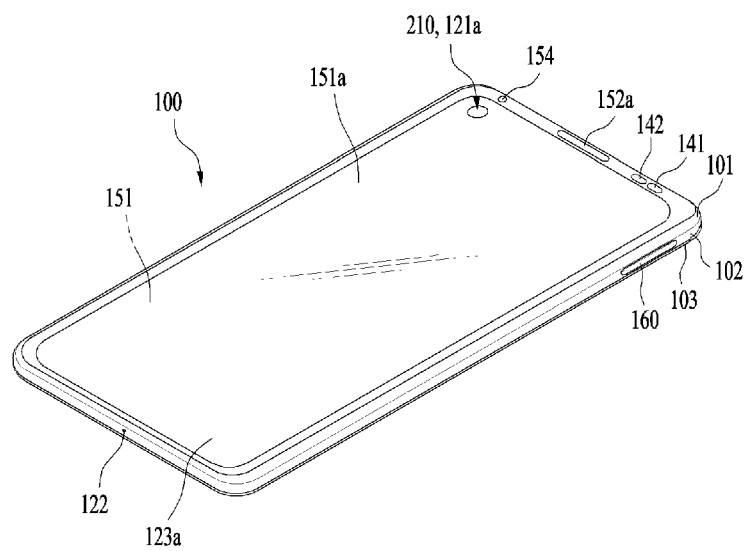
FIGS. 1B and 1C are conceptual views of one example of the mobile terminal, viewed from different directions.
Figure 1C:
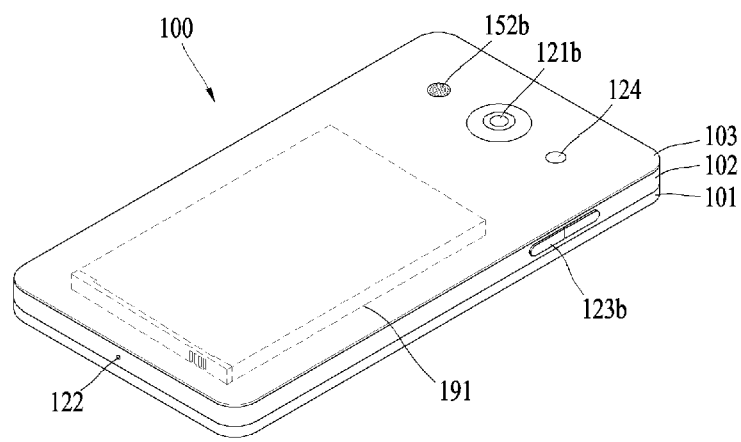

Reference is now made to FIGS. 1A-1C, where FIG. 1A is a block diagram of a mobile terminal in accordance with the present disclosure, and FIGS. 1B and 1C are conceptual views of one example of the mobile terminal, viewed from different directions.

The mobile terminal 100 is shown having components such as a wireless communication unit 110, an input unit 120, a sensing unit 140, an output unit 150, an interface unit 160, a memory 170, a controller 180, and a power supply unit 190. Referring now to FIG. 1A, the mobile terminal 100 is shown having wireless communication unit 110 configured with several commonly implemented components. It is understood that implementing all of the illustrated components is not a requirement, and that greater or fewer components may alternatively be implemented.

More specifically, the wireless communication unit 110 typically includes one or more modules which permit communications such as wireless communications between the mobile terminal 100 and a wireless communication system, communications between the mobile terminal 100 and another mobile terminal, communications between the mobile terminal 100 and an external server. Further, the wireless communication unit 110 typically includes one or more modules which connect the mobile terminal 100 to one or more networks.

To facilitate such communications, the wireless communication unit 110 includes one or more of a broadcast receiving module 111, a mobile communication module 112, a wireless Internet module 113, a short-range communication module 114, and a location information module 115.

The input unit 120 includes a camera 121 for obtaining images or video, a microphone 122, which is one type of audio input device for inputting an audio signal, and a user input unit 123 (for example, a touch key, a push key, a mechanical key, a soft key, and the like) for allowing a user to input information. Data (for example, audio, video, image, and the like) is obtained by the input unit 120 and may be analyzed and processed by controller 180 according to device parameters, user commands, and combinations thereof.

The sensing unit 140 is typically implemented using one or more sensors configured to sense internal information of the mobile terminal, the surrounding environment of the mobile terminal, user information, and the like. For example, the sensing unit 140 may alternatively or additionally include other types of sensors or devices, such as a proximity sensor 141 and an illumination sensor 142, a touch sensor, an acceleration sensor, a magnetic sensor, a G-sensor, a gyroscope sensor, a motion sensor, an RGB sensor, an infrared (IR) sensor, a finger scan sensor, a ultrasonic sensor, an optical sensor (for example, camera 121), a microphone 122, a battery gauge, an environment sensor (for example, a barometer, a hygrometer, a thermometer, a radiation detection sensor, a thermal sensor, and a gas sensor, among others), and a chemical sensor (for example, an electronic nose, a health care sensor, a biometric sensor, and the like), to name a few. The mobile terminal 100 may be configured to utilize information obtained from sensing unit 140, and in particular, information obtained from one or more sensors of the sensing unit 140, and combinations thereof.

The output unit 150 is typically configured to output various types of information, such as audio, video, tactile output, and the like. The output unit 150 is shown having a display unit 151, an audio output module 152, a haptic module 153, and an optical output module 154. The display unit 151 may have an inter-layered structure or an integrated structure with a touch sensor in order to facilitate a touch screen. The touch screen may provide an output interface between the mobile terminal 100 and a user, as well as function as the user input unit 123 which provides an input interface between the mobile terminal 100 and the user.

The interface unit 160 serves as an interface with various types of external devices that can be coupled to the mobile terminal 100. The interface unit 160, for example, may include any of wired or wireless ports, external power supply ports, wired or wireless data ports, memory card ports, ports for connecting a device having an identification module, audio input/output (I/O) ports, video I/O ports, earphone ports, and the like. In some cases, the mobile terminal 100 may perform assorted control functions associated with a connected external device, in response to the external device being connected to the interface unit 160.

The memory 170 is typically implemented to store data to support various functions or features of the mobile terminal 100. For instance, the memory 170 may be configured to store application programs executed in the mobile terminal 100, data or instructions for operations of the mobile terminal 100, and the like. Some of these application programs may be downloaded from an external server via wireless communication. Other application programs may be installed within the mobile terminal 100 at time of manufacturing or shipping, which is typically the case for basic functions of the mobile terminal 100 (for example, receiving a call, placing a call, receiving a message, sending a message, and the like). It is common for application programs to be stored in the memory 170, installed in the mobile terminal 100, and executed by the controller 180 to perform an operation (or function) for the mobile terminal 100.

The controller 180 typically functions to control overall operation of the mobile terminal 100, in addition to the operations associated with the application programs. The controller 180 may provide or process information or functions appropriate for a user by processing signals, data, information and the like, which are input or output, or activating application programs stored in the memory 170.

To drive the application programs stored in the memory 170, the controller 180 may be implemented to control a predetermined number of the components mentioned above in reference with FIG. 1A. Moreover, the controller 180 may be implemented to combinedly operate two or more of the components provided in the mobile terminal 100 to drive the application programs.

The power supply unit 190 can be configured to receive external power or provide internal power in order to supply appropriate power required for operating elements and components included in the mobile terminal 100. The power supply unit 190 may include a battery, and the battery may be configured to be embedded in the terminal body, or configured to be detachable from the terminal body.

Some or more of the components may be operated cooperatively to embody an operation, control or a control method of the mobile terminal in accordance with embodiments of the present disclosure. Also, the operation, control or control method of the mobile terminal may be realized on the mobile terminal by driving of one or more application problems stored in the memory 170.

Referring now to FIGS. 1B and 1C, the mobile terminal 100 is described with reference to a bar-type terminal body. However, the mobile terminal 100 may alternatively be implemented in any of a variety of different configurations. Examples of such configurations include watch-type, clip-type, glasses-type, or as a folder-type, flip-type, slide-type, swing-type, and swivel-type in which two and more bodies are combined with each other in a relatively movable manner, and combinations thereof. Discussion herein will often relate to a particular type of mobile terminal (for example, bar-type, watch-type, glasses-type, and the like).

Here, the terminal body may be understood to refer to the concept of this bore a mobile terminal (100) to at least one of the aggregate.

The mobile terminal 100 will generally include a case (for example, frame, housing, cover, and the like) forming the appearance of the terminal. In this embodiment, the case is formed using a front case 101 and a rear case 102. Various electronic components are incorporated into a space formed between the front case 101 and the rear case 102. At least one middle case may be additionally positioned between the front case 101 and the rear case 102.

The display unit 151 is shown located on the front side of the terminal body to output information. As illustrated, a window 151a of the display unit 151 may be mounted to the front case 101 to form the front surface of the terminal body together with the front case 101.

In some embodiments, electronic components may also be mounted to the rear case 102. Examples of such electronic components include a detachable battery 191, an identification module, a memory card, and the like. Rear cover 103 is shown covering the electronic components, and this cover may be detachably coupled to the rear case 102. Therefore, when the rear cover 103 is detached from the rear case 102, the electronic components mounted to the rear case 102 are externally exposed.

As illustrated, when the rear cover 103 is coupled to the rear case 102, a side surface of the rear case 102 is partially exposed. In some cases, upon the coupling, the rear case 102 may also be completely shielded by the rear cover 103. In some embodiments, the rear cover 103 may include an opening for externally exposing a camera 121b or an audio output module 152b.

The cases 101, 102, 103 may be formed by injection-molding synthetic resin or may be formed of a metal, for example, stainless steel (STS), aluminum (Al), titanium (Ti), or the like.

As an alternative to the example in which the plurality of cases form an inner space for accommodating components, the mobile terminal 100 may be configured such that one case forms the inner space. In this example, a mobile terminal 100 having a uni-body is formed in such a manner that synthetic resin or metal extends from a side surface to a rear surface.

If desired, the mobile terminal 100 may include a waterproofing unit (not shown) for preventing introduction of water into the terminal body. For example, the waterproofing unit may include a waterproofing member which is located between the window 151a and the front case 101, between the front case 101 and the rear case 102, or between the rear case 102 and the rear cover 103, to hermetically seal an inner space when those cases are coupled.

The mobile terminal 100 may include the display unit 151, the first and second audio output modules 152a and 152b, the proximity sensor 141, the illuminance sensor 142, the optical output module 154, the first and second cameras 121a and 121b, the first and second manipulation units 123a and 123b, the microphone 122 and the interface unit 160.

It will be described for the mobile terminal as shown in FIGS. 1B and 1C. The display unit 151, the first audio output module 152a, the proximity sensor 141, an illumination sensor 142, the optical output module 154, the first camera 121a and the first manipulation unit 123a are arranged in front surface of the terminal body, the second manipulation unit 123b, the microphone 122 and interface unit 160 are arranged in side surface of the terminal body, and the second audio output modules 152b and the second camera 121b are arranged in rear surface of the terminal body.

It is to be understood that alternative arrangements are possible and within the teachings of the instant disclosure. Some components may be omitted or rearranged. For example, the first manipulation unit 123a may be located on another surface of the terminal body, and the second audio output module 152b may be located on the side surface of the terminal body.

The display unit 151 is generally configured to output information processed in the mobile terminal 100. For example, the display unit 151 may display execution screen information of an application program executing at the mobile terminal 100 or user interface (UI) and graphic user interface (GUI) information in response to the execution screen information.

The display unit 151 outputs information processed in the mobile terminal 100. The display unit 151 may be implemented using one or more suitable display devices. Examples of such suitable display devices include a liquid crystal display (LCD), a thin film transistor-liquid crystal display (TFT-LCD), an organic light emitting diode (OLED), a flexible display, a 3-dimensional (3D) display, an e-ink display, and combinations thereof.

The display unit 151 may be implemented using two display devices, which can implement the same or different display technology. For instance, a plurality of the display units 151 may be arranged on one side, either spaced apart from each other, or these devices may be integrated, or these devices may be arranged on different surfaces.

The display unit 151 may also include a touch sensor which senses a touch input received at the display unit. When a touch is input to the display unit 151, the touch sensor may be configured to sense this touch and the controller 180, for example, may generate a control command or other signal corresponding to the touch. The content which is input in the touching manner may be a text or numerical value, or a menu item which can be indicated or designated in various modes.

The touch sensor may be configured in a form of a film having a touch pattern, disposed between the window 151a and a display on a rear surface of the window 151a, or a metal wire which is patterned directly on the rear surface of the window 151a. Alternatively, the touch sensor may be integrally formed with the display. For example, the touch sensor may be disposed on a substrate of the display or within the display.

The display unit 151 may also form a touch screen together with the touch sensor. Here, the touch screen may serve as the user input unit 123 (see FIG. 1A). Therefore, the touch screen may replace at least some of the functions of the first manipulation unit 123a.

The first audio output module 152a may be implemented in the form of a speaker to output voice audio, alarm sounds, multimedia audio reproduction, and the like.

The window 151a of the display unit 151 will typically include an aperture to permit audio generated by the first audio output module 152a to pass. One alternative is to allow audio to be released along an assembly gap between the structural bodies (for example, a gap between the window 151a and the front case 101). In this case, a hole independently formed to output audio sounds may not be seen or is otherwise hidden in terms of appearance, thereby further simplifying the appearance and manufacturing of the mobile terminal 100.

The optical output module 154 can be configured to output light for indicating an event generation. Examples of such events include a message reception, a call signal reception, a missed call, an alarm, a schedule notice, an email reception, information reception through an application, and the like. When a user has checked a generated event, the controller can control the optical output unit 154 to stop the light output.

The first camera 121a can process image frames such as still or moving images obtained by the image sensor in a capture mode or a video call mode. The processed image frames can then be displayed on the display unit 151 or stored in the memory 170.

The first and second manipulation units 123a and 123b are examples of the user input unit 123, which may be manipulated by a user to provide input to the mobile terminal 100. The first and second manipulation units 123a and 123b may also be commonly referred to as a manipulating portion, and may employ any tactile method that allows the user to perform manipulation such as touch, push, scroll, or the like. The first and second manipulation units 123a and 123b may also employ any non-tactile method that allows the user to perform manipulation such as proximity touch, hovering, or the like.

FIG. 1B illustrates the first manipulation unit 123a as a touch key, but possible alternatives include a mechanical key, a push key, a touch key, and combinations thereof.

Input received at the first and second manipulation units 123a and 123b may be used in various ways. For example, the first manipulation unit 123a may be used by the user to provide an input to a menu, home key, cancel, search, or the like, and the second manipulation unit 123b may be used by the user to provide an input to control a volume level being output from the first or second audio output modules 152a or 152b, to switch to a touch recognition mode of the display unit 151, or the like.

As another example of the user input unit 123, a rear input unit (not shown) may be located on the rear surface of the terminal body. The rear input unit can be manipulated by a user to provide input to the mobile terminal 100. The input may be used in a variety of different ways. For example, the rear input unit may be used by the user to provide an input for power on/off, start, end, scroll, control volume level being output from the first or second audio output modules 152a or 152b, switch to a touch recognition mode of the display unit 151, and the like. The rear input unit may be configured to permit touch input, a push input, or combinations thereof.

The rear input unit may be located to overlap the display unit 151 of the front side in a thickness direction of the terminal body. As one example, the rear input unit may be located on an upper end portion of the rear side of the terminal body such that a user can easily manipulate it using a forefinger when the user grabs the terminal body with one hand. Alternatively, the rear input unit can be positioned at most any location of the rear side of the terminal body.

Embodiments that include the rear input unit may implement some or all of the functionality of the first manipulation unit 123a in the rear input unit. As such, in situations where the first manipulation unit 123a is omitted from the front side, the display unit 151 can have a larger screen.

As a further alternative, the mobile terminal 100 may include a finger scan sensor which scans a user's fingerprint. The controller 180 can then use fingerprint information sensed by the finger scan sensor as part of an authentication procedure. The finger scan sensor may also be installed in the display unit 151 or implemented in the user input unit 123.

The microphone 122 is shown located at an end of the mobile terminal 100, but other locations are possible. If desired, multiple microphones may be implemented, with such an arrangement permitting the receiving of stereo sounds.

The interface unit 160 may serve as a path allowing the mobile terminal 100 to interface with external devices. For example, the interface unit 160 may include one or more of a connection terminal for connecting to another device (for example, an earphone, an external speaker, or the like), a port for near field communication (for example, an Infrared Data Association (IrDA) port, a Bluetooth port, a wireless LAN (local area network) port, and the like), or a power supply terminal for supplying power to the mobile terminal 100. The interface unit 160 may be implemented in the form of a socket for accommodating an external card, such as Subscriber Identification Module (SIM), User Identity Module (UIM), or a memory card for information storage.

The second camera 121b is shown located at the rear side of the terminal body and includes an image capturing direction that is substantially opposite to the image capturing direction of the first camera unit 121a. If desired, second camera 121a may alternatively be located at other locations, or made to be moveable, in order to have a different image capturing direction from that which is shown.

The second camera 121b can include a plurality of lenses arranged along at least one line. The plurality of lenses may also be arranged in a matrix configuration. The cameras may be referred to as an "array camera." When the second camera 121b is implemented as an array camera, images may be captured in various manners using the plurality of lenses and images with better qualities.

A flash 124 is shown located adjacent to the second camera 121b. When an image of a subject is captured with the camera 121b, the flash 124 may illuminate the subject.

The second audio output module 152b can be located on the terminal body. The second audio output module 152b may implement stereophonic sound functions in conjunction with the first audio output module 152a, and may be also used for implementing a speaker phone mode for call communication.

At least one antenna for wireless communication may be located on the terminal body. The antenna may be installed in the terminal body or formed by the case. For example, an antenna which configures a part of the broadcast receiving module 111 (see FIG. 1A). may be retractable into the terminal body. Alternatively, an antenna may be formed using a film attached to an inner surface of the rear cover 103, or a case that includes a conductive material.

A power supply unit 190 for supplying power to the mobile terminal 100 may include a battery 191, which is mounted in the terminal body or detachably coupled to an outside of the terminal body.

The battery 191 may receive power via a power source cable connected to the interface unit 160. Also, the battery 191 can be recharged in a wireless manner using a wireless charger. Wireless charging may be implemented by magnetic induction or electromagnetic resonance.

The rear cover 103 is shown coupled to the rear case 102 for shielding the battery 191, to prevent separation of the battery 191, and to protect the battery 191 from an external impact or from foreign material. When the battery 191 is detachable from the terminal body, the rear cover 103 may be detachably coupled to the rear case 102.

An accessory for protecting an appearance or assisting or extending the functions of the mobile terminal 100 can also be provided on the mobile terminal 100. As one example of an accessory, a cover or pouch for covering or accommodating at least one surface of the mobile terminal 100 may be provided. The cover or pouch may cooperate with the display unit 151 to extend the function of the mobile terminal 100. Another example of the accessory is a touch pen for assisting or extending a touch input to a touch screen.

Figure 2B:
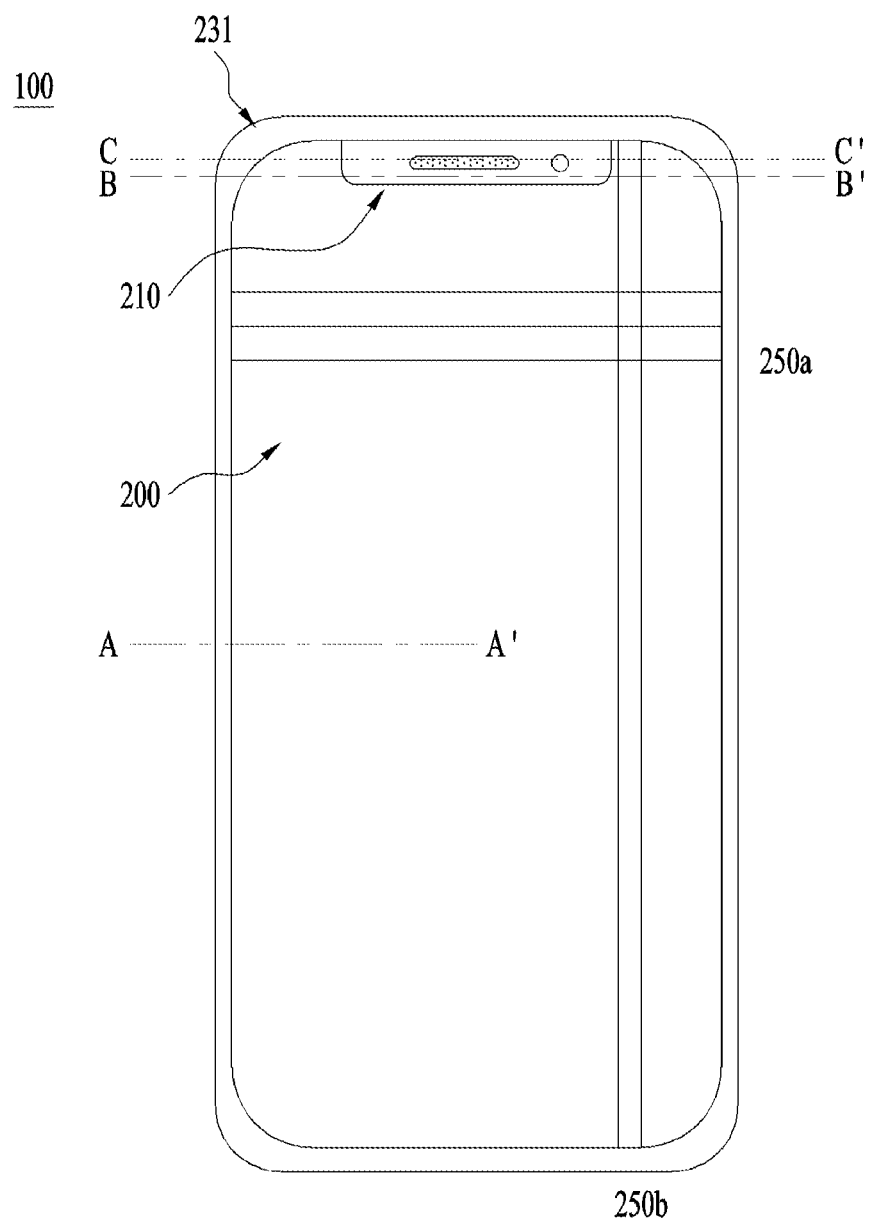

FIGS. 2A-2B are front views of the mobile terminal 100 in accordance with the present disclosure.

The above-described display unit 151 is a comprehensive concept including the window 151a, a display panel 201, and a component that combines these components with each other. When a backlight unit 206 is disposed depending on a type of the display panel 201, the display unit 151 may also include the backlight unit 206.

A front camera, a proximity sensor, a receiver, a light output unit, the display 200, and the like are arranged on a front surface of the mobile terminal 100.

The display 200 may be referred to as a concept similar to the above-described display unit 151. In particular, the display 200 is close to a concept of a region, which means an output region of the front surface of the mobile terminal.

Conventionally, the display 200 and the remaining electronic components are separated from each other, and the remaining components are arranged on a bezel 231. However, in response to a recent demand for minimizing the bezel 231 and maximizing a region of the display 200, a form in which at least some electronic components are arranged inside the display 200 has appeared.

As a representative form, there is a hole display 200 as shown in FIG. 2A or a notch display as shown in FIG. 2B. Some electronic components described above may be arranged in a non-output region 210 in the display 200.

In the embodiments of the present disclosure, a description will be achieved on the premise of the form of the hole display 200. However, the description may be applied to all forms in which the non-output region 210 is defined in the display 200 such as a notch display within a non-contradictory range.

Figure 3:
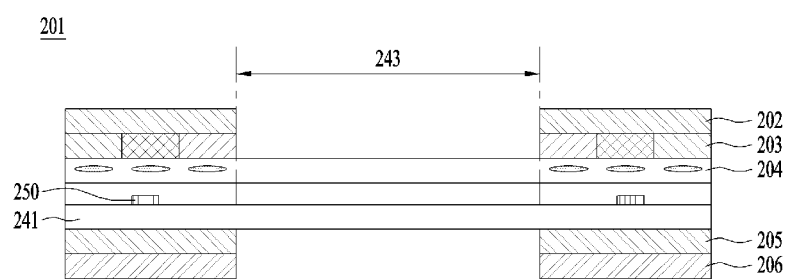
FIG. 3 is a cross-sectional view of FIG. 2A taken along a line A-A'.

FIG. 3 is a cross-sectional view of FIG. 2A taken along a line A-A'. For convenience of description, reference is made to FIG. 2A together.

A wire 250 is disposed on a TFT substrate 241 of the display panel 201, in particular, a front surface of the TFT substrate 241. The wire 250 is a place where information and power for outputting the screen of the display panel 201 are provided, which may include a gate line 250a and a data line 250b.

The gate line 250a and the data line 250b meet perpendicularly to each other to define the output region of the display 200. That is, a plurality of gate lines 250a extending in a left and right direction of the display 200 and a plurality of data lines 250b extending in an up and down direction of the display 200 cross each other at a plurality of points to define the output region. Only a few gate lines 250a and data lines 250b are indicated in FIG. 2A, but this is a rough representation, and in reality, a large number of lines are densely arranged throughout the output region.

A problem is the non-output region 210 of the display 200 described above.

Figure 4:
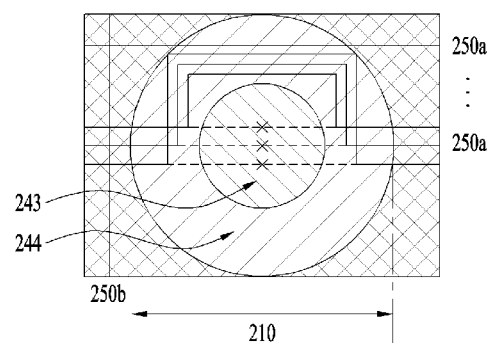
FIG. 4 is a conceptual diagram of a structure of a wire of a conventional non-output region.

FIG. 4 is a conceptual diagram of a structure of the wire 250 of a conventional non-output region.

The wire 250 is not able to pass through a hole 243 defined in the display 200. Nevertheless, portions of the output region at both sides of the hole 243 must be connected to each other by the wire 250. Therefore, the wire 250 must be connected by bypassing the hole 243.

In order to secure a bypass region 244 of the wire 250, the conventional non-output region 210 includes not only the hole 243 for arrangement of the sensor and the like, but also the bypass region 244 for bypassing the wire 250. Therefore, there is a disadvantage that the output region is relatively reduced.

(a) in FIG. 5 is a conceptual diagram of a region H in FIG. 2A, (b) in FIG. 5 is a cross-sectional view taken along a line B-B' in FIG. 2A, and (c) in FIG. 5 is a cross-sectional view taken along a line C-C' in FIG. 2A. (b) and (c) in FIG. 5 are cross-sectional views of different regions through which one wire 250 passes in the display panel 201. The present embodiment assumes that the wire 250 is the gate line 250a, but is able to be applied to the data line 250b in the same manner within a range that is not contradictory.

In the present disclosure, the description is achieved on the premise that the display panel 201 is a liquid crystal display (LCD). However, in some cases, the display panel 201 may be in a form of an organic light emitting diode.

In the display panel 201, an upper polarizing plate 202, a color filter (C/F) 203, a liquid crystal 204, the thin film transistor (TFT) substrate 241, a lower polarizing plate 205, and the backlight unit 206 are stacked in order in a downward direction. In this connection, in principle, a thin film transistor (TFT) named as the wire 250 in the present disclosure is disposed on the front surface of the TFT substrate 241.

In order to solve the conventional shortcomings, in the present disclosure, a form in which the wire 250 is connected by penetrating the display panel 201 in a thickness direction of the display panel 201 is presented. This is distinguished from bypassing on the front surface of the TFT substrate 241 as shown in FIG. 4.

That is, in the present disclosure, the bypass is performed through a specific rear layer, not the front surface of the TFT substrate 241.

For convenience of description, a wire 250 disposed on the front surface of the TFT substrate 241 is defined as a TFT wire 251 and a wire 250 connecting portions of the TFT wire 251 isolated because of the non-output region 210 with each other is defined as a bypass wire 252.

The TFT wire 251 is disposed on the front surface of the TFT substrate 241 to define the output region. The TFT wire 251 is isolated in the non-output region 210.

The TFT substrate 241 includes each via hole 245 defined therein at each isolated point of the TFT wire 251. The via hole 245 may be defined at the rear of the front surface of the TFT substrate 241, that is, in a thickness direction of the TFT substrate 241. As an example, the via hole 245 may be vertically defined in a downward direction in the TFT substrate 241. Because the TFT wire 251 is isolated at two points because of the non-output region 210, each via hole 245 is defined at each of the two isolated points.

As a result, the locations of the via holes 245 determine a size of the non-output region 210. The via holes 245 may be defined as close as possible to the hole 243 defining the non-output region 210. When the via holes 245 are defined as close as possible to the hole 243, because the TFT wire 251 may be disposed in a region as large as possible, the output region may be maximized.

The bypass wire 252 connects the isolated portions of the TFT wire 251 with each other through the via holes 245. The bypass wire 252 may be made of the same material and may have the same thickness as the TFT wire 251.

In this connection, the via hole 245 should not be exposed to the hole 243. The bypass wire 252 must be disposed through the via holes 245. This is because when the via hole 245 is defined to be exposed to the hole 243, the bypass wire 252 may be exposed to the outside.

For the above reason, the via hole 245 is defined at a specific distance G from the hole 243. As a result, a size of the non-output region 210 becomes a sum of a diameter of the hole 243 and a spaced distance G.

When the via holes 245 at the two points are defined in the thickness direction of the display panel 201, a bypass wire 252 passing through the via hole 245 is referred to as a vertical connection wire segment 2521, and a bypass wire 252 connecting ends of the respective vertical connection wires 2521 with each other while bypassing hole 243 is referred to as a horizontal connection wire segment 2522.

A length of the horizontal connection wire segment 2522 is related to a diameter of the non-output region 210. Also, because the horizontal connection wire segment 2522 does not directly affect the size of the non-output region 210, the horizontal connection wire segment 2522 may be in a relatively free form.

The location of the via hole 245 may correspond to a location of an electrode 2511 of the TFT wire 251.

A layer on which the horizontal connection wire segment 2522 is disposed of the display panel 201 changes based on a defined depth of the hole 245.

FIGS. 6 to 8 are more specific examples of the embodiment in FIG. 5, and respectively illustrate embodiments based on locations where the horizontal connection wire segment 2522 is disposed.

FIG. 6 is an embodiment of the mobile terminal 100 in accordance with the present disclosure.

The horizontal connection wire segment 2522 of the bypass wire 252 may be disposed on the TFT substrate 241. The horizontal connection wire segment 2522 may be disposed by penetrating the TFT substrate 241 or may be disposed on a rear surface of the TFT substrate 241.

FIG. 7 is an embodiment of the mobile terminal 100 in accordance with the present disclosure.

The horizontal connection wire segment 2522 of the bypass wire 252 may be disposed on the lower polarizing plate 205 disposed on the rear surface of the TFT substrate 241.

FIG. 8 is an embodiment of the mobile terminal 100 in accordance with the present disclosure.

The horizontal connection wire segment 2522 of the bypass wire 252 may be disposed on an additional layer 207 disposed between the TFT substrate 241 and the lower polarizing plate 205.

FIG. 9 is an embodiment of the mobile terminal 100 in accordance with the present disclosure.

FIG. 9 is described on the premise of the gate line 250a disposed in the left and right direction, but the gate line 250a may be generalized by the wire 250. Therefore, the present embodiment may be applied to the vertical direction within a range that is not contradictory, and may also be applied to the data line 250b.

Unlike the above embodiments, the portions of the output region isolated by the non-output region 210 may be distinguished and connected with each other by additional gate in panels (GIPs).

That is, when a first GIP 261 is disposed on one side of a region N, which is a region of the display panel 201 without the non-output region 210, and a fourth GIP 264 is disposed on the other side of the region N, and when the first GIP 261 and the fourth GIP 264 are connected to each other by the wire, a second GIP 262 is disposed on one side adjacent to the non-output region 210 in a region Y, which is a region of the display panel 201 with the non-output region 210, and a third GIP 263 is disposed on the other side adjacent to the non-output region 210, so that the first GIP 261 and the second GIP 262 are connected to each other by the wire 250, and the third GIP 263 and the fourth GIP 264 are connected to each other by the wire 250.

In the present embodiment, there is no need to have the separate wire 250 bypassing the non-output region 210 in the TFT substrate, as shown in the conventional art of FIG. 4, because of the addition of the second GIP 262 and the third GIP 263. Therefore, the size of the non-output region 210 may be minimized.

A GIP control signal of one side is applied to each of the first GIP 261 and the second GIP 262, and a GIP control signal of the other side is applied to each of the third GIP 263 and the fourth GIP 264. To this end, the first GIP 261 and the second GIP 262 are connected to the same control signal line 272, and the third GIP 263 and the fourth GIP 264 are also connected to the same control signal line. A GIP driver 271 may apply the control signal to each GIP.

Unlike the control signal line, voltage lines may be connected to different GIPs. That is, a voltage line 273 of one side may be connected to the first GIP 261 and the third GIP 263, and a voltage line 274 of the other side may be connected to the second GIP 262 and the fourth GIP 264. This may prevent image quality deterioration from occurring because of a difference between a voltage of one side and a voltage of the other side.

It is obvious to a person skilled in the art that the present disclosure may be embodied in other specific forms without departing from the spirit and essential characteristics of the present disclosure.

The detailed description described above should not be construed as restrictive in all respects and should be considered as illustrative. The scope of the present disclosure should be determined by reasonable interpretation of the appended claims, and all changes within the scope of the present disclosure are included in the scope of the present disclosure.

What is claimed is:

1. A mobile terminal comprising:
    a display panel including a non-output region that is contiguous to an output region of the display panel;
    a TFT (Thin Film Transistor) substrate included in the display panel;
    TFT wires disposed on a front surface of the TFT substrate to define the output region of the display panel, wherein the TFT wires include isolated TFT wires that have:
        first and second TFT wire segments that are isolated from each other by the non-output region, and
        third and fourth TFT wire segments that are isolated from each other by the non-output region;
    first and second via holes in the TFT substrate corresponding to inner end portions of the first and second TFT wire segments;
    third and fourth via holes in the TFT substrate corresponding to inner end portions of the third and fourth TFT wire segments; and
    a bypass wire connecting the inner end portions of the first and second TFT wire segments with each other through the first and second via holes while bypassing the non-output region,
    wherein the bypass wire includes:
        first, second, third and fourth vertical connection wire segments passing through respective ones of the first, second, third and fourth via holes;
        a first horizontal connection wire segment connecting ends of the first and second vertical connection wire segments with each other while bypassing the non-output region; and
        a second horizontal connection wire segment connecting ends of the third and fourth vertical connection wire segments with each other while bypassing the non-output region,
    wherein the first and second horizontal connection wire segments are located in different layers and overlap each other in a thickness direction.

2. The mobile terminal of claim 1, wherein the first and second horizontal connection wire segments are disposed on a back surface of the TFT substrate.

3. The mobile terminal of claim 1,
    wherein the display panel further includes a lower polarizing plate disposed on a rear surface of the TFT substrate,
    wherein the first and second horizontal connection wire segments are disposed on the lower polarizing plate.

4. The mobile terminal of claim 1, wherein the display panel further includes:
    a lower polarizing plate disposed on a rear surface of the TFT substrate; and
    an additional layer disposed between the lower polarizing plate and the TFT substrate,
    wherein the first and second horizontal connection wire segments are disposed on the additional layer.

5. The mobile terminal of claim 1, wherein each via hole is defined in a region corresponding to an electrode of the isolated TFT wires.

6. The mobile terminal of claim 1, wherein the non-output region corresponds to a notch region of a notch display.

7. The mobile terminal of claim 1, wherein the non-output region corresponds to a sensor hole.

8. The mobile terminal of claim 1, wherein at least one of the TFT wires is a gate line.

9. The mobile terminal of claim 1, wherein the non-output region is a circle having a diameter corresponding to a distance between the first and second via holes.

* * * * *